United States Patent
Kwon (10) Patent No.: US 6,822,995 B2
(45) Date of Patent: Nov. 23, 2004

(54) GAAS/Al(GA)AS DISTRIBUTED BRAGG REFLECTOR ON INP

(75) Inventor: Hoki Kwon, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 181 days.

(21) Appl. No.: 10/078,474

(22) Filed: Feb. 21, 2002

(65) Prior Publication Data

US 2003/0156611 A1 Aug. 21, 2003

(51) Int. Cl.$^7$ ................................................ H01S 3/08
(52) U.S. Cl. ........................... 372/96; 372/44; 372/45; 372/46; 372/43
(58) Field of Search .............................. 372/96, 46, 44, 372/45

(56) References Cited

U.S. PATENT DOCUMENTS

| | | |
|---|---|---|
| 4,445,218 A | 4/1984 | Coldren |
| 4,608,697 A | 8/1986 | Coldren |
| 4,622,672 A | 11/1986 | Coldren et al. |
| 4,829,347 A | 5/1989 | Cheng et al. |
| 4,873,696 A | 10/1989 | Coldren et al. |
| 4,896,325 A | 1/1990 | Coldren |
| 5,045,499 A | 9/1991 | Nishizawa et al. |
| 5,082,799 A | 1/1992 | Holmstrom et al. |
| 5,245,622 A | 9/1993 | Jewell et al. |
| 5,251,225 A | 10/1993 | Eglash et al. |
| 5,293,392 A | 3/1994 | Shieh et al. |
| 5,343,487 A | 8/1994 | Scott et al. |
| 5,358,880 A | 10/1994 | Lebby et al. |
| 5,365,540 A | 11/1994 | Yamanaka |
| 5,392,307 A | 2/1995 | Sugiyama et al. |
| 5,408,110 A * | 4/1995 | Janz et al. ................. 257/97 |
| 5,416,044 A | 5/1995 | Chino et al. |
| 5,422,901 A | 6/1995 | Lebby et al. |

(List continued on next page.)

FOREIGN PATENT DOCUMENTS

| | | |
|---|---|---|
| EP | 0 740 377 B | 10/1996 |
| EP | 0 740 377 A1 | 10/1996 |
| EP | 0 765 014 A1 | 3/1997 |
| EP | 0 822 630 A1 | 2/1998 |
| EP | 0 874 428 B1 | 4/1998 |
| EP | 0 874 428 A2 | 10/1998 |
| EP | 0 874 428 A3 | 11/1998 |
| EP | 0 765 014 B1 | 7/1999 |

(List continued on next page.)

OTHER PUBLICATIONS

International Search Report, dated Aug. 9, 2003, relative to PCT application No. PCT/US 03/05368, the foreign equivalent to the instant U.S. application 10/078,474.

Akiyama, Y., et al., "Growth of High Quality GaAs Layers on Si Substrates by Mocvd". 1986, Journal of Crystal Growth, pp. 490–497.

(List continued on next page.)

*Primary Examiner*—Don Wong
*Assistant Examiner*—Dung T Nguyen
(74) *Attorney, Agent, or Firm*—Workman Nydegger (57) ABSTRACT

A vertical cavity surface emitting laser having a GaAs/Al(Ga)As DBR mirror over an InP layer A first GaAs layer is MOCVD grown on an InP layer at a growth temperature of between 400 and 450° C. Then a second GaAs layer is grown by MOCVD at a growth temperature of about 600° C. over the first GaAs layer. A GaAs/Al(Ga)As DBR mirror is then grown over the second GaAs layer. Beneficially, an insulating layer is disposed between the second GaAs layer and the GaAs/Al(Ga)As DBR mirror. The insulating layer includes an opening that exposes the second GaAs layer. Then the GaAs/Al(Ga)As DBR mirror is grown by lateral epitaxial overgrowth. The lower DBR can be comprised of a material that provides an acceptable lattice match with InP layers. A tunnel junction can be formed over an InP active region.

20 Claims, 3 Drawing Sheets

U.S. PATENT DOCUMENTS

| | | | |
|---|---|---|---|
| 5,468,343 A | 11/1995 | Kitano | |
| 5,491,710 A | 2/1996 | Lo | |
| 5,513,204 A | 4/1996 | Jayaraman | |
| 5,568,504 A | 10/1996 | Kock et al. | |
| 5,574,738 A * | 11/1996 | Morgan | 372/28 |
| 5,588,995 A | 12/1996 | Sheldon | |
| 5,631,472 A | 5/1997 | Cunningham et al. | |
| 5,693,180 A | 12/1997 | Furukawa et al. | |
| 5,719,891 A | 2/1998 | Jewell | |
| 5,719,894 A | 2/1998 | Jewell et al. | |
| 5,719,895 A | 2/1998 | Jewell et al. | |
| 5,729,567 A | 3/1998 | Nakagawa | |
| 5,732,103 A | 3/1998 | Ramdani et al. | |
| 5,745,515 A * | 4/1998 | Marta et al. | 372/45 |
| 5,747,366 A | 5/1998 | Brillouet et al. | |
| 5,754,578 A | 5/1998 | Jayaraman | |
| 5,757,833 A | 5/1998 | Arakawa et al. | |
| 5,805,624 A | 9/1998 | Yang et al. | |
| 5,809,051 A | 9/1998 | Oudar | |
| 5,815,524 A | 9/1998 | Ramdani et al. | |
| 5,818,862 A | 10/1998 | Salet | |
| 5,818,863 A | 10/1998 | Nabet et al. | |
| 5,825,796 A | 10/1998 | Jewell et al. | |
| 5,835,521 A | 11/1998 | Ramdani et al. | |
| 5,877,038 A | 3/1999 | Coldren et al. | |
| 5,883,912 A | 3/1999 | Ramdani et al. | |
| 5,898,722 A | 4/1999 | Ramdani et al. | |
| 5,903,586 A | 5/1999 | Ramdani et al. | |
| 5,912,913 A | 6/1999 | Kondow et al. | |
| 5,943,357 A | 8/1999 | Lebby et al. | |
| 5,943,359 A | 8/1999 | Ramdani et al. | |
| 5,956,363 A | 9/1999 | Lebby et al. | |
| 5,960,018 A | 9/1999 | Jewell et al. | |
| 5,974,073 A | 10/1999 | Canard et al. | |
| 5,978,398 A | 11/1999 | Ramdani et al. | |
| 5,985,683 A | 11/1999 | Jewell | |
| 5,991,326 A | 11/1999 | Yuen et al. | |
| 6,021,147 A | 2/2000 | Jiang et al. | |
| 6,044,100 A * | 3/2000 | Hobson et al. | 372/46 |
| 6,046,065 A | 4/2000 | Goldstein et al. | |
| 6,049,556 A | 4/2000 | Sato | |
| 6,052,398 A | 4/2000 | Brillouet et al. | |
| 6,057,560 A | 5/2000 | Uchida | |
| 6,061,380 A | 5/2000 | Jiang et al. | |
| 6,061,381 A | 5/2000 | Adams et al. | |
| 6,121,068 A | 9/2000 | Ramdani et al. | |
| 6,127,200 A | 10/2000 | Ohiso et al. | |
| 6,144,682 A * | 11/2000 | Sun | 372/45 |
| 6,148,016 A | 11/2000 | Hegblom et al. | |
| 6,195,485 B1 | 2/2001 | Coldren et al. | |
| 6,207,973 B1 | 3/2001 | Sato et al. | |
| 6,252,896 B1 | 6/2001 | Tan et al. | |
| 6,314,118 B1 | 11/2001 | Jayaraman et al. | |
| 6,341,137 B1 | 1/2002 | Jayaraman et al. | |
| 6,359,920 B1 | 3/2002 | Jewell et al. | |
| 6,362,069 B1 | 3/2002 | Forrest et al. | |
| 6,366,597 B1 | 4/2002 | Yuen et al. | |
| 6,372,533 B2 | 4/2002 | Jayaraman et al. | |
| 6,424,669 B1 | 7/2002 | Jiang et al. | |
| 6,434,180 B1 | 8/2002 | Cunningham | |
| 6,542,530 B1 | 4/2003 | Shieh et al. | |
| 6,542,531 B2 * | 4/2003 | Sirbu et al. | 372/46 |
| 6,546,031 B1 | 4/2003 | Jewell et al. | |
| 6,556,349 B2 | 4/2003 | Cox et al. | |
| 6,556,602 B2 | 4/2003 | Rice et al. | |
| 6,566,688 B1 | 5/2003 | Zhang et al. | |
| 6,580,741 B2 | 6/2003 | Jiang et al. | |
| 6,603,784 B1 | 8/2003 | Johnson | |
| 6,621,842 B1 | 9/2003 | Dapkus | |
| 6,621,843 B2 | 9/2003 | Yoo et al. | |
| 6,628,685 B1 | 9/2003 | Shieh | |
| 6,642,070 B2 | 11/2003 | Jiang et al. | |
| 6,653,158 B2 | 11/2003 | Hall et al. | |
| 2002/0027232 A1 * | 3/2002 | Shigematsu et al. | 257/197 |
| 2002/0067748 A1 | 6/2002 | Coldren et al. | |
| 2002/0071464 A1 | 6/2002 | Coldren et al. | |
| 2002/0071471 A1 | 6/2002 | Kim et al. | |
| 2002/0075920 A1 | 6/2002 | Spruytte et al. | |
| 2002/0075929 A1 | 6/2002 | Cunningham | |
| 2002/0090016 A1 | 7/2002 | Coldren et al. | |
| 2002/0131462 A1 | 9/2002 | Line et al. | |
| 2003/0053510 A1 | 3/2003 | Yuen et al. | |
| 2003/0086463 A1 | 5/2003 | Shin et al. | |
| 2003/0103543 A1 | 6/2003 | Moser et al. | |
| 2003/0118067 A1 | 6/2003 | Johnson | |
| 2003/0118068 A1 | 6/2003 | Johnson | |
| 2003/0118069 A1 | 6/2003 | Johnson | |
| 2003/0123501 A1 | 7/2003 | Johnson | |
| 2003/0123511 A1 | 7/2003 | Johnson | |
| 2003/0134448 A1 | 7/2003 | Ju et al. | |
| 2003/0156610 A1 | 8/2003 | Kwon | |
| 2003/0156611 A1 | 8/2003 | Kwon | |
| 2003/0156616 A1 | 8/2003 | Kwon | |
| 2003/0157739 A1 | 8/2003 | Jiang et al. | |
| 2003/0231680 A1 | 12/2003 | Burak | |

FOREIGN PATENT DOCUMENTS

| | | |
|---|---|---|
| EP | 0 999 621 B1 | 11/1999 |
| EP | 0 975 073 A1 | 1/2000 |
| EP | 1 294 063 A1 | 3/2003 |
| JP | 57026492 A | 2/1982 |
| WO | WO 98/007218 A1 | 2/1998 |
| WO | WO 00/052789 A3 | 2/2000 |
| WO | WO 00/052789 A2 | 2/2000 |
| WO | WO 00/033433 A3 | 6/2000 |
| WO | WO 00/033433 A2 | 6/2000 |
| WO | WO 00/038287 A1 | 6/2000 |
| WO | WO 00/065700 A3 | 11/2000 |
| WO | WO 00/065700 A2 | 11/2000 |
| WO | WO 01/016642 A2 | 3/2001 |
| WO | WO 01/016642 A3 | 3/2001 |
| WO | WO 01/017076 A3 | 3/2001 |
| WO | WO 01/017076 A2 | 3/2001 |
| WO | WO 01/018919 A1 | 3/2001 |
| WO | WO 01/024328 A2 | 4/2001 |
| WO | WO 01/024328 A3 | 4/2001 |
| WO | WO 01/033677 A3 | 5/2001 |
| WO | WO 01/033677 A2 | 5/2001 |
| WO | WO 01/052373 A3 | 7/2001 |
| WO | WO 01/052373 A2 | 7/2001 |
| WO | WO 01/084682 A2 | 11/2001 |
| WO | WO 01/093387 A3 | 12/2001 |
| WO | WO 01/093387 A2 | 12/2001 |
| WO | WO 01/095444 A2 | 12/2001 |
| WO | WO 01/098756 A2 | 12/2001 |
| WO | WO 02/003515 A2 | 1/2002 |
| WO | WO 02/017445 A1 | 2/2002 |
| WO | WO 02/084829 A1 | 10/2002 |
| WO | WO 03/052797 A1 | 6/2003 |

OTHER PUBLICATIONS

Almuneau, G., et al., "Accurate control of Sb composition in AlGaAsSb alloys on InP substrates by molecular beam epitaxy", article, May 6, 1999, pp. 113–116, vol. 208, Journal of Crystal Growth.

Almuneau, G., et al., "Improved electrical and thermal properties of InP–AlGaAsSb Bragg mirrors for long–wavelength vertical–cavity lasers", article, Oct. 2000, pp. 1322–1324, vol. 12, No. 10, IEEE Photonics Technology Letters.

Almuneau, G., et al., "Molecular beam epitaxial growth of monolithic 1.55 $\mu$m vertical cavity surface emitting lasers with AlGaAsSb/AlAsSb Bragg mirrors", article, May/Jun. 2000, pp. 1601–1604, vol. 8, No. 3, Journal of Vacuum Science Technology.

Anan, T., et al., "Continuous–wave operation of 1.30$\mu$m GaAsSb/GaAs VCSELs", article, Apr. 26, 2001, pp. 568–567, vol. 37, No. 9, Electronics Letters.

Black, K., et al., "Double–fused 1.5 PLUS CODE 83 IS NOT DEFINEDm vertical cavity lasers with record high $T_o$ of 132K at room temperature", article, Oct. 1, 1998, pp. 1947–1949, vol. 34, No. 20, Electronics Letters.

Blum, O., et al., "Electrical and optical characteristics of AlAsSb/BaAsSb distributed Bragg reflectors for surface emitting lasers", article, Nov. 27, 1995, pp. 3233–3235, vol. 67, No. 22, Applied Physics Letters.

Blum, O., et al., "Highly reflective, long wavelength AlAsSb/GaAsSb distributed Bragg reflector grown by molecular beam epitaxy on InP substrates", article, Jan. 16, 1995, pp. 329–331, vol. 66, No. 3, Applied Physics Letters.

Boucart, J., et al., "1mW CW–RT monolithic VCSEL at 1.55 $\mu$m", article, Jun. 1999, pp. 629–631, vol. 11, No. 6., IEEE Photonic Technology Letters.

Boucart, J., et al., "Metamorphic DBR and Tunnel–Junction Injection: A CW RT Monolithic Long–Wavelength VCSEL", May/Jun. 1999, pp. 520–529, IEEE Journal of Selected Topics in Quantum Electronics, vol. 5, No. 3.

Boucart, J., et al., "Optimization of the Metamorphic Growth of GaAs for long wavelength VCSELs", 1999, pp. 1015–1019, Journal of Crystal Growth 201/202.

Campbell, J., et al., "Quantum dot resonant cavity photo-diode with operation near 1.3 $\mu$m wavelength", article, Jul. 17, 1997, pp. 1337–1339, vol. 33, No. 15, Electronics Letters.

Chang, C:, et al., "Parasitics and design considerations on oxide–implant VCSELs", article, Dec. 2001, pp. 1274–1276, vol. 13, No. 12, IEEE Photonics Technology Letters.

Chertouk, H., "Metamorphic inAlAs/InGaAs HEMTs on GaAs substrates with a novel composite channels design", article, Jun. 1996, pp. 273–275, vol. 17, No. 6, IEEE Electron Device Letters.

Choquette, K., et al., "Room temperature continuous wave InGaAsN quantum well vertical–cavity lasers emitting at 1.3 $\mu$m", article, Aug. 3, 2000, pp. 1388–1390, vol. 36, No. 16, Electronics Letters.

Demeester; A.,. et al., "GaAs on InP: a promising material combination", article, Mar., 1989, pp. 44–48, Chemtronics vol. 4.

Dowd, P., et al., "Long wavelength (1.3 and 1.5 $\mu$m) photoluminescence from InGaAs/GaPAsSb quantum wells grown on GaAs", article, Aug. 30, 1999, pp. 1267–1269, vol. 75, No. 9, Applied Physics Letters.

Dudley, J., et al., "Water fused long wavelength vertical cavity lasers", conference proceedings, Nov. 15/8, 1993, pp. 560–561, LEOS '93 Conference Proceedings, IEEE Lasers and Electro–Optics Society 1993 Annual Meeting.

Goldstein, L., et al., "GaAlAs/GaAs metamorphic Bragg mirror for long wavelength VCSELs", article, Feb. 5, 1998, Lov. 34, No. 3, Electronics Letters.

Gourley, F., et al., "Epitaxial semiconductor optical interference devices", invited paper, 1987, pp. 178–189, vol. 792, SPIE.

Guden, M., et al., "Material parameters of quaternary III–V semiconductors for multiplayer mirrors at 1.55 $\mu$m wavelength", article, 1996, pp. 349–357, vol. 4, Modeling Simulation Material Science Engineering, United Kingdom.

Guo, C., et al., "Theoretical investigation of strained InGaAs/GaPAsSb type–II quantum wells on GaAs for long wavelength (1.3 $\mu$m) optoelectronic devices", post–conference paper, Apr. 1999, pp. 30–31, Dept of Electrical Engineering & Center for Solid State Electronics Research, ASU, Tempe, AZ.

Guy, D., et al., "Theory of an electro–optic modulator based on quantum wells in a semiconductor □talon", conference paper, Mar. 23/4, 1987, pp. 189–196, Quantum Well and Superlattice Physics.

Hall, E., et al., "Electrically–pumped, single–epitaxial VCSELs at 1.55 $\mu$m with Sb–based mirrors", article, Aug. 5, 1999, pp. 1–2, vol. 35, No. 16, Electronics Letters.

Hall, E., et al., "Increased lateral oxidation rates of AlInAs on InP using short–period superlattices", article, Jan. 8, 2002, pp. 1100–1104, vol. 29, No. 9, Applied Physics Letters.

Hall, E., et al., "Selectively etched undercut apertures in AlAsSb–based VCSELs", article, Feb. 2001, pp. 97–99, vol. 13, No. 2, IEEE Photonics Technology Letters.

Hegblom, E., et al., "Small efficient vertical cavity lasers with tapered oxide apertures", article, Apr. 30, 1998, pp. 895–896, vol. 34, No. 9, Electronics Letters.

Heroux J., et al., "Optical investigation of InGaAsN/GaAs strained multi–quantum wells", Oct. 1–3, 2001, p. 2, 20th North American Conference on Molecular Beam Epitaxy.

Hong, Y., et al., "Improving Ga(In)Nas properties by migration–enhanced epitaxy and superlattices", Jun. 27, 2001, 43rd 2001 Electronic Material Conference, Session G, Paper G10.

Hong, Y., et al., "Growth of GaInNAs quaternaries using a digital allow technique", conference paper, Oct. 01/3, 2001, pp. 1163–1166, Journal of Vacuum Science and Technology B: Microelectronics and Nanometer Structures.

Huffaker, D., et al., "1.15 $\mu$m wavelength oxide–confined quantum–dot vertical–cavity surface–emitting laser", article, Feb. 1998, pp. 185–187, vol. 10, No. 2, IEEE Photonics Technology Letters.

Huffaker, D., et al., "1.3 $\mu$m room–temperature GaAs–based quantum–dot laser", Nov. 2, 1998, pp. 2564–2566, vol. 73, No. 18, Applied Physics Letters.

IGA, K., "Semiconductor laser in the 21st century", California conference papers, Jan. 22/4, 2001, pp. xi–xxv, Photodetectors: Materials and Devices VI.

Jayaraman, V., et al., "Uniform threshold current, continuous–wave, single mode 1300 nm vertical cavity lasers from 0 to 70° C.", article, Jul. 9, 1998, pp. 1405–1407, vol. 34, No. 14, Electronics Letters.

Kim, J., et al., "Epitaxially–stacked multiple–active–region 1.55 $\mu$m lasers for increased differential efficiency", article, May 31, 1999, pp. 3251–3253, vol. 74, No. 22, Applied Physics Letters.

Kim, J., et al., "Room–temperature, electrically–pumped multiple–active–region VCSELs with high differential efficiency at 1.55 $\mu$m", article, Jun. 24, 1999, pp. 1–2, vol. 35, No. 13, Electronics Letters.

Kondow, M., et al., "A Novel Material of BaInNAs for Long–Wavelength–Range Laser Diodes with Excellent High–Temperature Performance", Extended Abstracts of the 1995 International Conference on Solid State Devices and Materials, Osaka, 1995, pp. 1016–1018.

Kondow, M., et al., "GaInNAs: A Novel Material for Long–Wavelength–Range Laser Diodes with Excellent High–Temperature Performance", Feb. 1996, Jpn. J. Appl. Phys., vol. 35, pp. 1273–1275.

Kotaki, Y., et al., "GanAsP/InP surface emitting laser with two active layers", article, 1984, pp. 133–136, Extended Abstracts of the 16th (1984 International) conference on Solid State Devices and Materials.

Koyama, F., et al., "Room temperature CWS operation of GaAs vertical cavity surface emitting laser", article, Nov. 1988, pp. 1089–1090, vol. E71, No. 11, the Transactions of the IEICE.

Larson, J., et al., "GaInNAs–GaAs long–wavelength vertical–cavity surface–emitting laser diodes", article, Feb. 1998, pp. 188–190, vol. 10, No. 2, IEEE Photonics Technology Letters.

Lee, Y., et al., "Physics and nonlinear device applications of bulk and multiple quantum well GaAs", Invited paper, 1987, pp. 128–133, SPIE vol. 792 Quantum Well and Superlattice Physics (1987).

Li, J., et al., "Persistent photoconductivity in $Ga_{1-x}In_xN_yAs_{1-y}$", article, Sep. 27, 1999, pp. 1899–1901, vol. 75, No. 13, Applied Physics Letters.

Livshits, E., "8W continuous wave operation of InGaAsN lasers at 1.3 $\mu$m", article, Aug. 3, 2000, pp. 1381–1382, vol. 36, No. 16, Electronics Letters.

Mirin, R:, et al., "1.3 $\mu$m photoluminescence from InGaAs quantum dots on GaAs", article, Dec. 18, 1995, pp. 3795–3797, Applied Physics Letter 67 (25).

Nakagawa, S., et al., "1.55 $\mu$m InP–lattice–matched VCSELs with AlGaAsSb–AlAsSb DBRs", article, Mar./Apr. 2001, pp. 224–230, vol. 7, No. 2, IEEE Journal on Selected Topics in Quantum Electronics.

Nakahara, K., et al., "1.3 $\mu$m continuous–wave lasing operation in GaInNAs quantum–well lasers", article, Apr. 1998, pp. 487–488, vol. 10, No. 4, IEEE Photonics Technology Letters.

Nakahara, K., et al., "Continuous–wave operation of long–wavelength GaInNAs/GaAs quantum well laser", article, Jun. 13, 1996, pp. 1585–1586, vol. 32, No. 17, IEE Electronics Letters Online No.: 19961039.

Naone, R., et al., "Tapered air apertures for thermally robust VCL structures", article, Nov. 1999, pp. 1339–1341, vol. 11, No. 11, IEEE Photonics Technology Letters.

Nelson, D., et al., "Band nonparabolicity effects in semiconductor quantum wells", article, Feb. 15, 1987, pp. 7770–7773, vol. 35, No. 17, Rapid Communications.

Ohnoki, N., et al., "Superlattice AlAs/AllnAs–oxide current aperture for long wavelength InP–based vertical–cavity surface–emitting laser structure", article, No. 30, 1998, pp. 3262–3264, vol. 73, No. 22, Applied Letters.

Ortsiefer, M., et al., "Submillamp long–wavelength InP–based vertical–cavity surface–emitting laser with stable linear polarization", article, Jun. 22, 2000, pp. 1124–1126, vol. 36, No. 13, Electronics Letters.

Peters, M., et al., "Realization and modeling of a pseudomorphic $(GaAs_{1-x}Sb_x-In_y Ga_{1-y}As)$/GaAs bilayer–quantum well", article, Oct. 30, 1995, pp. 2639–2641, Applied Physics Letter 67 (18).

Peters, M., et al., Band–gap engineered digital alloy interfaces for lower resistance vertical–cavity surface–emitting lasers, article, Dec. 1993, pp. 3411–3413, vol. 63, No. 25, Applied Physics Letters.

Piprek, J., et al., "Thermal comparison of long–wavelength vertical–cavity surface–emitting laser diodes", May 26, 1994, pp. 866–868, vol. 30, No. 11, Electronics Letters.

Piprek, J., et al., "Minimum temperature sensitivity of 1.55 $\mu$m vertical–cavity lasers at–30 gain offset", article, Apr. 13, 1998, pp. 1814–1816, vol. 72, No. 15, Applied Physics Letters.

Raja, M., et al., "Novel wavelength–resonant optoelectronic structure and its application to surface–emitting semiconductor lasers", article, Sep. 1, 1988, pp. 1140–1142, vol. 24, No. 18, Electronics Letters.

Scott, J., et al., "High efficiency submilliamp vertical cavity lasers with intracavity contacts", article, Jun. 1994, pp. 678–80, vol. 6, No. 6, IEEE Photonics Technology Letters.

Sekiguchi, S., et al., "Long wavelength GaInAsP/InP laser with n–n contacts using AlAs/InP hole injecting tunnel junction", article Apr. 15, 1999, pp. L443–L445, Part 2, No. 48, Japanese Journal of Applied Physics.

Shimomura, H., et al. "High–reflectance ALPsb/GaPSb distributed Bragg reflector mirrors on InP grown by gas–source molecular beam epitaxy", article, Dec. 20, 1993, Electronics Letters Online No.: 19940230.

Starck, C., et al., "Fabrication of 1.55um oxidized VCSELs with top metamorphic GaAs/GaAlAs and bottom InP/InGaAsP Bragg reflectors", May 15, 1998, 10th International Conference on Indium Phosophide and Related Materials, pp. 369–372.

Starck, C., "Long–wavelength VCSEL with tunnel junction and metamorphic AlAs/GaAs conductive DBR", article, Jan. 15, 1989, pp. 1871–1883, vol. 39, No. 3, Physics Review B.

Sugimoto, M., et al., "Surface emitting devices with distribut4ed Bragg reflectors grown by higly precise molecular beam epitaxy", article, 1993, pp. 1–4, vol. 127, Journal of Crystal Growth.

Strassburg, M, Growth and p–type doping of ZnSeTe on Inp. Technische Universitat Berlin, Institut fur Festkorperphysik, 10623 Berlin, Germany, National Technical University, Faculty of Applied Sciences, 15780 Athens, Greece, ICMOVPE XI Web–Booklet May 17, 2002.

Uchida, T., et al., "CBE grown 1.5 $\mu$m GaInAsP–InP surface emitting lasers", article, Jun. 1993, pp. 1975–1980, vol. 29, No. 6, IEEE Journal of Quantum Electronics.

Van De Walle, C. "Ban lineups and deformation potentials in the model–solid theory", article, Jan. 15, 1989, pp. 1871–1883, vol. 39, No. 3, Physical Review B.

Whitaker, T., "Long wavelengths VCSELs move closer to reality", article, Jul. 2000, pp. 65–67, Compound Semiconductor.

Wipiejewski, T. Improved performance of vertical–cavity surface–emitting laser diodes with Au–plated heat spreading layer,Reprinted from Electronic letters, Feb. 16, 1995, vol. 31, No. 4 pp. 279–280.

Yamada, M., et al., "Low–threshold lasing at 1.3 $\mu$m from GaAsSb quantum wells directly grown on GaAs substrates", article, Apr. 1998, pp. 149–150, IEEE, 0–7803–4947.

Yamada, M., et al., "Room temperature low–threshold CW operation of 1.23 $\mu$m GaAsSb VCSELs on GaAs substrates", article, Mar. 30, 2000, pp. 637–638, vol. 36, No. 7, Electronics Letters.

Yang, X., et al., "High performance 1.3 μm InGaAsN:Sb/GaAs quantum well lasers grown by molecular beam epitaxy", journal article, Oct. 1999, pp. 1484–1487, vol. 18, No. 3, Journal of Vacuum Science and Technology B Microelectronics and Nanometer Structures.

Yang, X., et al., "High–temperature characteristics of 1.3 μm in InGaAsN:Sb/GaAs multiple–quantum–well lasers grown by molecular–beam epitaxy", article, Feb. 14, 2000, pp. 795–797, vol. 76, Applied Physics Letters.

Yang, X., et al., "InGaAsNSb/GaAs quantum wells for 1.55 μm lasers grown by molecular–beam epitaxy", article, pp. 4068–4070, vol. 78, No. 26, Applied Physics Letters.

Yano, M., et al., "Time–resolved reflection high energy electron diffraction analysis for atomic layer depositions of GaSb by molecular beam epitaxy", article, 1995, pp. 349–353, vol. 146, Journal of Crystal Growth.

Yuen, W., et al., "High–performance 1.6 μm single–epitaxy top–emitting vCSEL", article, Jun. 22, 2000, pp. 1121–1123, vol. 36, No. 13, Electronics Letters.

Zeng, L. Red–green–blue photopumped lasing from ZnCdMgSe/ZnCeSe quantum well laser structures grown on InP, Received Mar. 10, 1998 accepted for publication, Apr. 15, 1998, 1998 American Institute of Physics. (S0003–6951(98)02524–8).

International Search Report, dated Aug. 9, 2003, relative to PCT application No. PCT/US 03/05368, the foreign equivalent to the instant U.S. application 10/078474.

Akiyama, M., et al., Growth of high quality GaAs layers on Si substrates by MOCVD., Journal of Crystal Growth, vol. 77, 1986 pp. 490–497.

Boucart J et al., "Metamorphic DBR and Tunnel–Junction Injection: A CW RT Monolithic Long–Wavelength VCSEL," IEEE Journal of Selected Topics in Quantum Electronics, IEEE Service Center, US, vol. 5 No. 3 May 1999, pp. 520–529.

Boucart, J., et al., "Optimization of the metamorphic growth of GaAs for long wavelength VCSELs", article, Journal of Crystal Growth, 201–202, 1999, pp. 1015–1019.

Demeester, P. et al., "GaAs on InP: a promising material combination", article, Chemtronics, vol. 4, Mar. 1989, pp. 44–48.

Gebretsadik H et al. "Growth of High–Quality GAAS/ALAS Bragg Mirrors Patterned Inp–Based Quantum Well Mesa Structures" Applied Physics Letters, American Institute of Physics. New York, US, vol. 71, No. 5, Aug. 4, 1997, pp. 581–583.

Goldstein L. et al. "Metamorphic GAAS/ALAS Bragg Mirrors for Deposited on INP For 1,3/1,55 Mum Vertical Cavity Lasers" Digest IEEE/LEOS Summer Topical Meetings, XX, XX, Aug. 11, 1987 pp. 49–50.

Goldstein L. et al., "GaAlAs/GaAs metamorphic Bragg mirror for long wavelength VCSELs", article, Electronics Letters, vol. 34, No. 3, Feb. 5, 1998, pp. 268–270.

Shimomura, H., et al. "High–reflectance AlPsb/GaPSb distributed Bragg reflector mirrors on InP grown by gas–source molecular beam epitasy", article, Electronics Letters, vol. 30, No. 4, Feb. 17, 1994 pp. 314–315.

Starck, C., "Fabrication of 1.55 μm oxidized VCSELs with top metamorphic GaAs/GaAlAs and bottom InP/InGaAsP Bragg reflectors", article, IEEE $10^{th}$ International Conference on Indium Phosphide and Related Materials, Tsukba Japan, May 11–5, 1998, pp. 369–372.

Yuen, W. et al. "High–performance 1.6 Micrometers Single–Epitaxy Top–Emitting VCSEL" Electronics Letters, IEE Steverage, GB, vol. 36, No. 13, Jun. 22, 2000 whole document.

* cited by examiner

*Figure 1*

PRIOR ART

GAAS/AI(GA)AS DISTRIBUTED BRAGG REFLECTOR ON INP

This invention was made with the United States Government support under 70NAHB8H4023 awarded by National Institute of Science and Technology (NIST). The United States Government has certain rights in the invention.

BACKGROUND OF THE INVENTION

1. Field of the Invention

This invention relates to vertical cavity surface emitting lasers. More specifically, it relates to GaAs/Al(Ga)As Distributed Bragg Refelectors (DBRs) as used in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Because of their complicated structure, and because of their material requirements, VCSELs are usually grown using metalorganic chemical vapor deposition (MOCVD).

Figure 1:
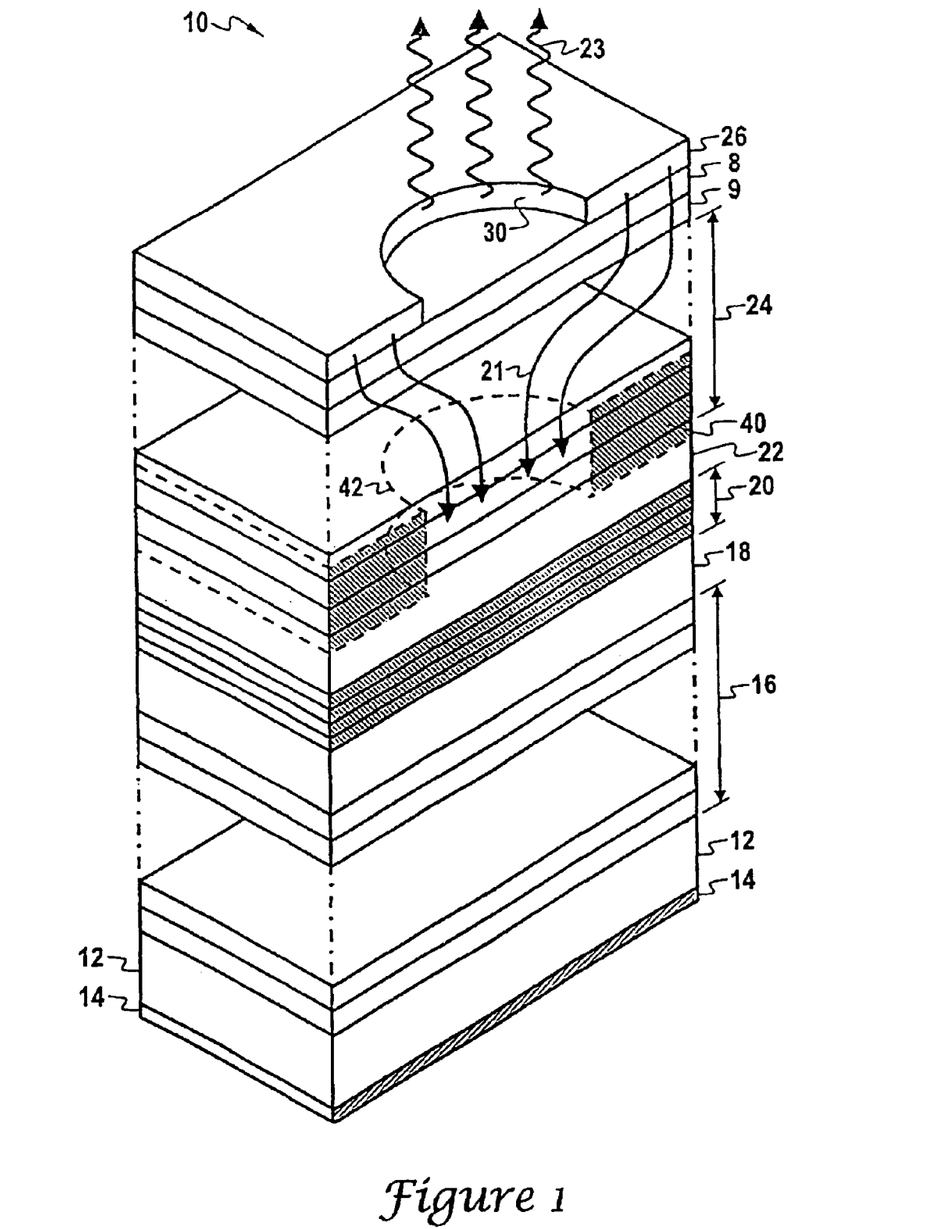
FIG. 1 illustrates a typical vertical cavity surface emitting laser.

FIG. 1 illustrates a typical VCSEL 10. As shown, an n-doped gallium arsenide (GaAs) substrate 12 has an n-type electrical contact 14. An n-doped lower mirror stack 16 (a DBR) is on the GaAs substrate 12, and an n-type graded-index lower spacer 18 is disposed over the lower mirror stack 16. An active region 20, usually having a number of quantum wells, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 such that the current flows through the conductive central opening 42 and into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate), different material systems can be used, operational details can be tuned for maximum performance, and additional structures, such as tunnel junctions, can be added. Furthermore, with long wavelengths it is often beneficial to insert a reversed biased n++/p++ tunnel junction between the top spacer 22 and the active region 20, and to change the doping type of the top structures to n-type. This is because p-doped materials absorb more light than n-doped materials, and with longer wavelengths the optical gain become more critical. The tunnel junction converts electrons into holes, which are then injected into the active region.

While generally successful, VCSELs have problems. For example, a major problem in realizing commercial quality long wavelength VCSELs is the available mirror materials. Long wavelength VCSELs are often based on InP material systems. For proper lattice matching, an InP-based VCSEL usually uses InP/InGaAsP or AlInAs/AlInGaAs mirrors. However, because those materials have relatively low refractive index contrasts, 40–50 mirror pairs are typically needed to achieve the required high reflectivity. Growing that number of mirror pairs takes a long time, which increases the production costs.

Other mirror material systems have been tried. For example, "Metamorphic DBR and tunnel-Junction Injection: A CW RT Monolithic Long-Wavelength VCSEL," IEEE Journal of Selected topics In Quantum Electronics, vol. 5, no. 3, May/June 1999, describes an InP-InGaAsP DBR, a GaAlAsSb-AlAsSb DBR, and a GaAlIsSb-AlAsSb DBR. Furthermore, that article describes using a reversed biased n++/p++ tunnel junction for injecting current into the active layer. While such mirror material systems are advantageous, their lattice match, refractive index contrast, and thermal conductivity characteristics are not optimal. Additionally, GaAs/Al(Ga)As is still considered to form the best distributed Bragg reflector mirrors because of its high refractive index contrast, high thermal conductivity, and the feasibility of using oxidation to enable the formation of oxide insulating regions 40.

Thus, new long wavelength VCSELS would be beneficial. Also beneficial would be GaAs/Al(Ga)As top DBRs that are fabricated on InP. Also beneficial would be a method of fabricating GaAs/Al(Ga)As top DBRs in InP-based VCSELs. Furthermore, a new type of InP based VCSEL having GaAs/Al(Ga)As top DBRs and bottom mirror systems comprised of different materials also would be beneficial.

SUMMARY OF THE INVENTION

Accordingly, the principles of the present invention are directed to VCSEL device structures suitable for use in long wavelength VCSELS. Those principles specifically provide for a new method of growing GaAs/Al(Ga)As top DBRs on InP materials. Those principles further provide for InP-based VCSELS having GaAs/Al(Ga)As top DBRs. Such VCSELS can be fabricated with bottom mirrors comprised of different material systems. Therefore, the principles of the present invention directly provide for VCSELS device structures that enable InP-based VCSELs having GaAs/Al(Ga)As top mirror DBRs and bottom mirror systems of different materials.

A GaAs/Al(Ga)As top DBR according to the principles of the present invention is grown on InP using MOCVD and multi-step processing. The multi-step processing proceeds as follows. First, an InP layer (such as an InP spacer or an InP-based active layer) is formed. Then, an MOCVD growth temperature is set to about 400–450° C. Then, a 20–40 nanometer thick, fast GaAs layer is grown on the InP layer. After that, the temperature is increased to around 600° C. A high temperature GaAs seed layer, about 100 nm thick, is then grown on the low temperature GaAs layer. Beneficially, an insulation layer comprised of $SiO_2$ or $Si_2N_4$ is formed on the GaAs seed layer. If used, that insulation layer is patterned to form an opening. Then, a high temperature GaAs/Al(Ga)As top DBR is grown on the GaAs seed layer. The GaAs/Al(Ga)As mirror is beneficially grown using lateral epitaxial overgrowth.

A VCSEL according to the principles of the present invention includes a bottom DBR mirror on an InP substrate, which is beneficially n-doped. Then, an n-doped bottom InP spacer is grown on the bottom DBR mirror. Beneficially, an active region having a plurality of quantum wells is then grown on the n-doped InP spacer. Beneficially, a reversed biased tunnel junction is disposed over the active region. An n-doped top InP spacer is then beneficially grown on the tunnel junction. Also beneficially, an n-doped GaAs/Al(Ga)As top DBR is grown on the n-doped top InP spacer.

Preferably, the GaAs/Al(Ga)As top DBR is grown by a multi-step process using MOCVD. First, the growth temperature is set to 400–450° C. Then, a 20–40 nanometer thick low temperature GaAs layer is grown on the n-doped top InP spacer. After that, the temperature is increased to around 600° C. A high temperature GaAs seed layer, about 100 nm thick, is then grown on the low temperature GaAs layer. Then an insulation layer comprised of $SiO_2$ or $Si_2N_4$ is formed on the GaAs seed layer. The insulation layer is patterned to form an opening. A high temperature GaAs layer is then grown on the GaAs seed layer, followed by a GaAs/Al(Ga)As top DBR. The high temperature GaAs layer and the GaAs/Al(Ga)As mirror are beneficially grown using lateral epitaxial overgrowth.

Beneficially, a VCSEL according to the principles of the present invention includes a bottom DBR fabricated using a material system that is compatible with InP. For example, the bottom mirror could be an AlPSb/GaPsb DBR mirror, an AlGaInAs/AlInAs DBR mirror, or an InP/InGaAsP DBR.

According to another aspect of the present invention, a bottom AlGaInAs/AlInAs DBR mirror, an AlPSb/GaPsb DBR mirror, or an InP/InGaAsP DBR mirror is grown on an n-doped InP substrate. Then, an n-doped bottom InP spacer is grown on the bottom mirror. Beneficially, an active region having a plurality of quantum wells is then grown on the n-doped bottom InP spacer, followed by a reversed biased N++/P++ tunnel junction over the active region. An n-doped top InP spacer is beneficially grown on the tunnel junction. Also beneficially, an n-doped GaAs/Al(Ga)As top DBR is grown on the n-doped top InP spacer.

Preferably, the GaAs/Al(Ga)As top DBR is grown by a multi-step process using MOCVD. First, the growth temperature is set to 400–450° C. Then, a 20–40 nanometer thick low temperature GaAs layer is grown on the n-doped top InP spacer. After that, the temperature is increased to around 600° C. A high temperature GaAs seed layer, about 100 nm thick, is then grown on the low temperature GaAs layer. Then, an insulation layer comprised of $SiO_2$ or $Si_2N_4$ is formed on the GaAs seed layer. That insulation layer is then patterned to form an opening. A high temperature GaAs layer is then grown on the GaAs seed layer. Then, a GaAs/Al(Ga)As top DBR is grown on the high temperature GaAs layer. The GaAs layer and the GaAs/Al(Ga)As mirror are beneficially grown using lateral epitaxial overgrowth.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

The principles of the present invention are incorporated in an illustrated embodiment VCSEL having a top DBR mirror comprised of GaAs/Al(Ga)As that is grown on an InP layer. An example of such a VCSEL is the VCSEL 100 illustrated in FIG. 2.

Figure 2:
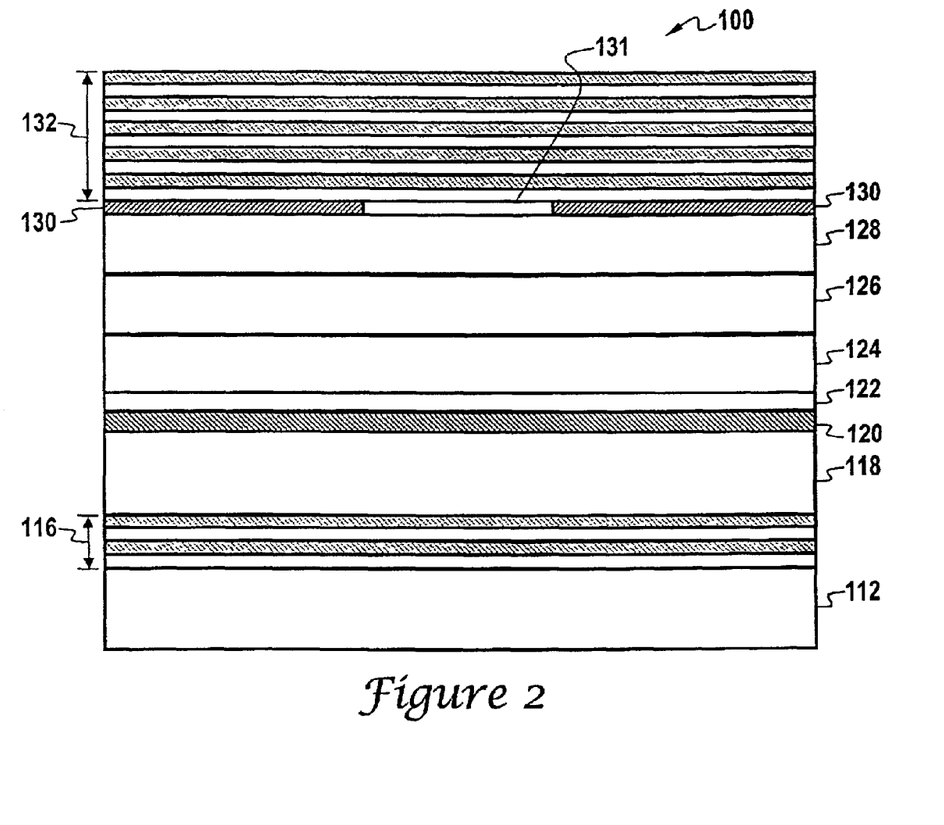
FIG. 2 illustrates a first embodiment vertical cavity surface emitting laser that is in accord with the principles of the present invention.

As shown in FIG. 2, the VCSEL 100 includes an n-doped InP substrate 112 having an n-type electrical contact (which is not shown for clarity). Over the InP substrate 112 is an n-doped lower mirror stack 116 (a DBR) comprised of a plurality of alternating layers of materials that are suitably matched to the InP substrate. For example, the lower mirror stack 116 can be comprised of AlGaInAs/AlInAs, AlPSb/GaPsb, or InP/InGaAsP. Over the lower mirror stack 116 is an n-doped bottom InP spacer 118. The lower mirror stack 116 is beneficially grown on the InP substrate using MOCVD. Then, the bottom InP spacer 118 is grown, also using MOCVD. An active region 120 comprised of P-N junction structures and a large number of quantum wells is then formed over the bottom InP spacer 118. The composition of the active region 120 is beneficially InP.

Over the active region 120 is a tunnel junction 122 comprised of a reverse biased n++/p++ junction.

Beneficially, the tunnel junction includes a p-layer comprised of MOCVD-grown GaAs$_{(1-x)}$Sb$_x$. During MOVCD, TMGa (or TEGa), TMSb, and AsH$_3$ (or TBAs) are beneficially used to produce the GaAs$_{(1-x)}$Sb$_x$ layer. Beneficially, that layer's solid composition is controlled by controlling the ratio of As to Sb. The MOCVD growth temperature is between 500° C. and 650° C. Doping is beneficially performed using CCl$_4$ or CBr$_4$ such that the resulting p-doping is greater 1×10$^{19}$ cm$^{-3}$. In practice, a p-doping greater than 5×10$^{19}$ cm$^{-3}$ is beneficial. It should be noted that the GaAs$_{(1-x)}$Sb$_x$ layer can have a doping as high as 1×10$^{20}$ cm$^{-3}$ without annealing. By setting x=0.5 a tunnel junction that is lattice matched to InP is produced (but GaAs$_{(.5)}$Sb$_{0.5}$ has a bandgap of 0.71 eV at 300K). An alternative is to set x=0.4, 0.3, or 0.23, which produce GaAs$_{(1-x)}$Sb$_x$ layers with bandgaps of 0.8 eV, 0.91 eV, or 1 eV, but which are not lattice matched to the InP active region 120. At x=0.3, or 0.23 the strains respectively become 1.4% or 1.95%, which, while not ideal, are much better than the 3.55% strain of AlAs on InP.

The tunnel junction 122 further includes an n-doped layer of InP, AlInAs, or of a lower bandgap material such as AlInGaAs or InGaAsP. The n-doped layer should also be heavily doped (greater than 5×10$^{19}$ cm$^{-3}$) and very thin (less than about 10 nanometers). For good lattice matching, the VCSEL 100 uses an InP n-type layer in the tunnel junction 122.

Over the tunnel junction 122 is an n-type InP top spacer 124. Then, a top mirror structure (which includes another DBR) is disposed over the top spacer 124.

The top mirror structure is beneficially comprised of a low temperature grown GaAs buffer layer 126 over the top spacer 124, a high temperature GaAs buffer layer 128 (which acts as a seed layer) over the GaAs buffer layer 126, an insulating structure (beneficially comprised of SiO$_2$) 130 over most of the GaAs buffer layer 128, and a GaAs/Al(Ga)As mirror stack 132 over the insulating structure 130. A shown, the insulating structure includes an opening 131 that enables current flow through the VCSEL 100.

The top mirror structure implements a device quality GaAs/Al(Ga)As mirror stack 132 over the top spacer 124. This is beneficial because in many applications, GaAs/Al(Ga)As is considered to be the best material for Bragg mirrors because of its high refractive index contrast (GaAs:AlAs=3.377:2.893), high thermal conductivity (GaAs:AlAs=0.46:0.8), and its oxidation potential. However, GaAs/Al(Ga)As is seriously lattice mismatched with InP. Thus, to produce a device-quality GaAs/Al(Ga)As mirror stack, MOCVD is used in a multi-step process to form intermediate GaAs buffer layers.

Figure 3:
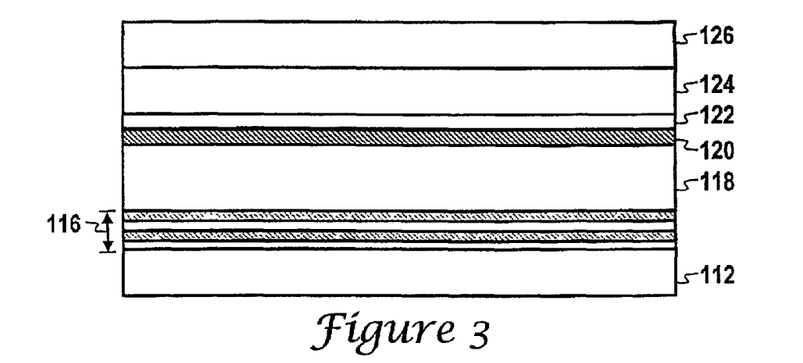
FIG. 3 illustrates an intermediate structure during fabrication of the vertical cavity surface emitting laser illustrated in FIG. 2.

FIG. 3 illustrates the first step of the two-step process. A low temperature GaAs buffer layer 126 is formed over the InP spacer 124. The low temperature GaAs buffer layer 126 is produced by adjusting the MOCVD growth temperature to about 400–450° C., and then MOCVD growing the low temperature GaAs buffer layer 126 to a thickness of about 20–40 nm.

Figure 4:
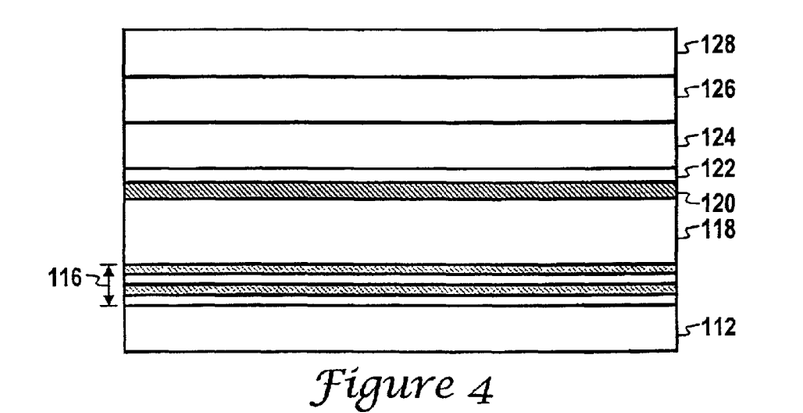
FIG. 4 illustrates another intermediate structure during fabrication of the vertical cavity surface emitting laser illustrated in FIG. 2.

Referring now to FIG. 4, after the low temperature GaAs buffer layer 126 is formed, the temperature is increased to around 600° C. Then, the high temperature GaAs buffer layer 128 is grown. The GaAs buffer layer 128 acts as a seed layer for subsequent growth.

Figure 5:
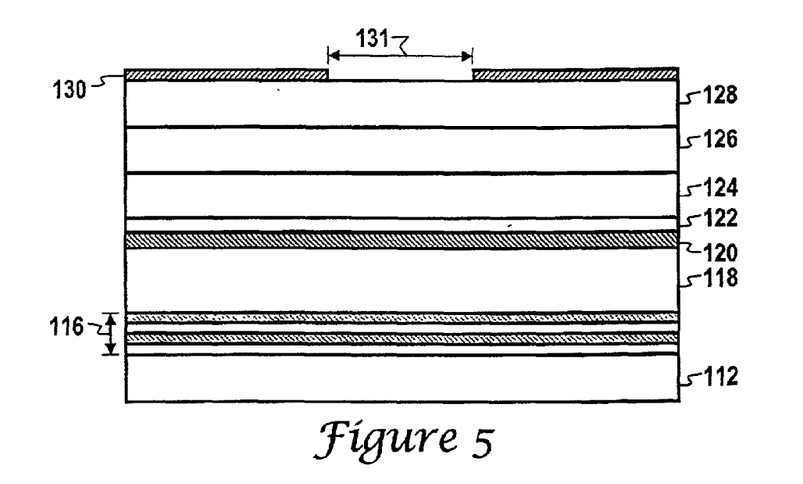
FIG. 5 illustrates yet another intermediate structure during fabrication of the vertical cavity surface emitting laser illustrated in FIG. 2.

Referring now to FIG. 5, after the GaAs buffer layer 128 is grown, a dielectric layer of SiO$_2$ (alternatively of Si$_3$N$_4$) is deposited and patterned to form the insulating structure 130. To do so, the intermediate structure shown in FIG. 4 is removed from the MOCVD reactor vessel. Then, a dielectric layer of SiO$_2$ (alternatively Si$_3$N$_4$) is deposited on the insulating structure 130. Then, the deposited dielectric layer is patterned to produce the insulating structure 130 having the opening 131. The insulating structure 130 provides a suitable surface for lateral epitaxial overgrowth. After the insulating structure 130 formed, the intermediate structure of FIG. 5 is inserted into the MOCVD reactor vessel. Referring once again to FIG. 2, the GaAs/Al(Ga)As mirror stack 132 is then grown by MOCVD. That mirror stack is produced by lateral epitaxial overgrowth from the GaAs buffer layer 128 through the opening 131. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) are produced.

The VCSEL 100 has significant advantages over prior art long wavelength InP-based VCSELs. First, the multi-step MOCVD process of forming a low temperature GaAs layer and a high temperature GaAs seed layer enables a device quality GaAs/Al(Ga)As top mirror to be used with an AlInGaAs or InGaAsP active region 120 and an InP top spacer 124. Another advantage is that the tunnel junction 122 enables n-doped top layers to be used, which reduces optical absorption (which can be critically important in long wavelength VCSELs). Yet another advantage is the use of different DBR materials in the bottom DBR and in the top DBR. This enables maximizing the benefits of different material systems. Still another advantage is the incorporation of current confinement structures and the use of lateral epitaxial overgrowth to produce the top DBR mirror. The overall result can be VCSELs having improved performance, increased reliability, faster fabrication, and reduced cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming GaAs distributed Bragg reflector, comprising:
   forming an InP layer;
   growing a fast GaAs layer on the InP layer at a temperature of between 400–450° C.;
   growing a second GaAs layer on the fast GaAs layer at a temperature of about 600° C.; and
   forming a GaAs/Al(Ga)As distributed Bragg reflector on the second GaAs layer.

2. A method of forming a GaAs distributed Bragg reflector according to claim 1, wherein the fast GaAs layer is grown using MOCVD.

3. A method of forming a GaAs distributed Bragg reflector according to claim 1, wherein the fast GaAs layer is grown to a thickness of between 20 and 40 nanometers.

4. A method of forming a GaAs distributed Bragg reflector according to claim 1, further including forming an insulation layer over the second GaAs layer, the insulation layer including an opening to the second GaAs layer, and the insulation layer is a overgrown with a lateral epitaxial overgrowth.

5. A method of forming a GaAs distributed Bragg reflector according to claim 4, wherein the insulation layer is comprised of silicon oxide.

6. A method of forming a GaAs distributed Bragg reflector according to claim 4, wherein the insulation layer is comprised of silicon nitride.

7. A vertical cavity surface emitting laser, comprising:

an InP layer;

a first GaAs layer on said InP layer, wherein said first GaAs layer is formed by MOCVD at a temperature between 400–450° C.; and a second GaAs layer on said first GaAs layer, wherein said second GaAs layer is formed by MOCVD at a temperature of around 600° C.

8. A vertical cavity surface emitting laser according to claim 7, further comprising a GaAs/Al(Ga)As distributed Bragg reflector on said second GaAs layer.

9. A vertical cavity surface emitting laser according to claim 8, further including an insulation layer over said second GaAs layer, said insulation layer having an opening to said second GaAs layer, wherein said GaAs/Al(Ga)As distributed Bragg reflector is grown on said insulation layer using a lateral epitaxial overgrowth.

10. A vertical cavity surface emitting laser according to claim 9, wherein said InP layer is a spacer.

11. A vertical cavity surface emitting laser according to claim 7, wherein said first GaAs layer is between 20 and 40 nanometers thick.

12. A vertical cavity surface emitting laser, comprising:

an InP substrate;

a lower DBR over said InP substrate;

a bottom InP spacer over said lower DBR;

an InP active layer over said bottom InP spacer;

a top InP spacer over said InP active layer;

a first GaAs layer on said top InP spacer, wherein said first GaAs layer is formed by MOCVD at a temperature between 400–450° C.; and a second GaAs layer on said first GaAs layer, wherein said second GaAs layer is formed by MOCVD at a temperature of around 600° C.

13. A vertical cavity surface emitting laser according to claim 12, further including a GaAs/Al(Ga)As DBR mirror stack on said second GaAs buffer layer.

14. A vertical cavity surface emitting laser according to claim 13, further including an insulating structure on said second GaAs buffer layer, wherein said insulating structure includes an opening.

15. A vertical cavity surface emitting laser according to claim 14, wherein said GaAs/Al(Ga)As DBR mirror stack is grown over said insulating structure by lateral epitaxial overgrowth.

16. A vertical cavity surface emitting laser according to claim 15, further including a tunnel junction between said InP active layer and said top InP spacer.

17. A vertical cavity surface emitting laser according to claim 16, wherein said tunnel junction is comprised of MOCVD-grown GaAs(1-31)Sbx.

18. A vertical cavity surface emitting laser according to claim 12, wherein said first GaAs layer is between 20 and 40 nanometers thick.

19. A vertical cavity surface emitting laser according to claim 12, wherein said lower DBR and said GaAs/Al(Ga)As DBR mirror stack are of different material systems.

20. A vertical cavity surface emitting laser according to claim 14, wherein said insulating structure includes SiO2 or Si2N4.

* * * * *

UNITED STATES PATENT AND TRADEMARK OFFICE
CERTIFICATE OF CORRECTION

PATENT NO.       : 6,822,995 B2
APPLICATION NO.  : 10/078474
DATED            : November 23, 2004
INVENTOR(S)      : Hoki Kwon It is certified that error appears in the above-identified patent and that said Letters Patent is hereby corrected as shown below:

Title Page
Item 54, and col. 1, line 1, TITLE, change "GAAS/AI(GA)AS DISTRIBUTED BRAGG REFLECTOR ON INP" to --GAAS/AL(GA)AS DISTRIBUTED BRAGG REFLECTOR ON INP--
Page 2, right column, line 65, change "InP-AlGaAs5b" to --Inp-AlGaAsSb--
Page 3, left column, line 8, change "568–567" to --566–567--
Page 3, left column, lines 9 & 10, change "PLUS CODE 83 IS NOT DEFINEDm" to --$\mu$m--
Page 3, left column, line 64, change "Lov. 34" to --Vol. 34--
Page 4, left column, line 1, change "BaInNAs" to --GaInNAs--
Page 4, left column, line 10, change "GanAsP/InP" to --GaInAsP/InP--
Page 4, right column, line 9, before "gain offset" insert --nm--
Page 4, right column, line 22, change "48," to --413,--
Page 4, right column, line 23, change "ALPsb/GaPSb" to --AlPSb/GaPSb--
Page 4, right column, line 36, change "distribut4ed" to --distributed--
Page 4, right column, line 39, change "Inp." to --InP.--
Page 4, right column, line 47, change "Ban" to --Band--
Page 5, left column, line 9, before "Applied Physics Letters" insert -- No. 7,--
Page 5, left column, line 29, before "Journal of Crystal Growth" insert --article,--
Page 5, right column, line 15, change "1987" to --1997--
Page 5, right column, line 19, change "AlPsb/GaPSb" to --AlPSb/GaPSb--

Column 1
Line 1, TITLE, change "GAAS/AI(GA)AS" to --GAAS/AL(GA)AS--
Line 35, change "GaAS" to --GaAs--
Line 49, change "resonant" to --resonate--

Column 2
Line 19, change "become" to --becomes--
Line 61, change "VCSELS" to --VCSELs--
Line 64, before "having" change "VCSELS" to --VCSELs--
Line 64, after "Such" change "VCSELS" to --VCSELs--
Line 67, change "VCSELS" to --VCSELs--

Column 3
Line 8, before "MOCVD" change "an" to --a--
Line 48, change "AlPSb/GaPsb" to --AlPSb/GaPSb--
Line 57, change "N++/P++" to --n++/p++--

UNITED STATES PATENT AND TRADEMARK OFFICE
CERTIFICATE OF CORRECTION

PATENT NO. : 6,822,995 B2
APPLICATION NO. : 10/078474
DATED : November 23, 2004
INVENTOR(S) : Hoki Kwon It is certified that error appears in the above-identified patent and that said Letters Patent is hereby corrected as shown below:

Column 4
Line 36, after "Note" remove [that]
Line 58, change "GaPsb" to --GaPSb--
Line 60, change "Inp" too --InP--

Column 5
Line 9, after "greater" insert --than--
Line 37, after "130." change "A" to --As--
Line 65, change "Si0$_2$" to --SiO$_2$--

Column 6
Line 2, change "Si0$_2$" to --SiO$_2$--
Line 7, after "130" insert --is--
Line 37, change "variation" to --variations--

Column 8
Line 22, change "GaAs(1-31 )Sbx." to --GaAs(1-x)Sbx.--

Signed and Sealed this

Nineteenth Day of February, 2008

JON W. DUDAS
*Director of the United States Patent and Trademark Office*